(12) United States Patent
Luh

(10) Patent No.: US 12,439,550 B2
(45) Date of Patent: Oct. 7, 2025

(54) FAN MODULE AND ELECTRONIC DEVICE

(71) Applicant: PEGATRON CORPORATION, Taipei (TW)

(72) Inventor: Hong-Yu Luh, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 363 days.

(21) Appl. No.: 18/326,982

(22) Filed: May 31, 2023

(65) Prior Publication Data

US 2024/0023272 A1    Jan. 18, 2024

(30) Foreign Application Priority Data

Jul. 18, 2022   (TW) .................................. 111126896

(51) Int. Cl.
*H05K 7/20*   (2006.01)

(52) U.S. Cl.
CPC ..... *H05K 7/20172* (2013.01); *H05K 7/20145* (2013.01)

(58) Field of Classification Search
CPC ................. H05K 7/20172; H05K 7/20145
See application file for complete search history.

(56) References Cited

U.S. PATENT DOCUMENTS

| 6,400,568 | B1 * | 6/2002 | Kim .......................... G06F 1/20 174/16.3 |
| 6,906,920 | B1 * | 6/2005 | Whitted ............. H05K 7/20154 165/104.34 |
| 7,209,352 | B2 * | 4/2007 | Chen ................... H05K 7/20727 415/213.1 |

FOREIGN PATENT DOCUMENTS

| CN | 212028184 | 11/2020 |
| TW | 201706769 | 2/2017 |

* cited by examiner

*Primary Examiner* — Michael L Sehn
(74) *Attorney, Agent, or Firm* — J.C. PATENTS

(57) ABSTRACT

An electronic device includes a casing having sliding rails and fan modules disposed in the casing. Each fan module includes a fan having an air inlet, a baffle disposed at the air inlet, an electromagnet electrically connected to the fan, a ferromagnetic slider, and a first connector connected between the ferromagnetic slider and the baffle. The ferromagnetic slider is disposed on the corresponding sliding rail and is located between the electromagnet and the fan for moving between the electromagnet and the fan along the corresponding sliding rail. When the fan is functioning, the electromagnet attracts the ferromagnetic slider to drive the baffle to expose the air inlet. When the fan is powered off, the electromagnet does not attract the ferromagnetic slider, the first connector drives the ferromagnetic slider away from the electromagnet, and the baffle moves to shield the air inlet.

12 Claims, 2 Drawing Sheets

FAN MODULE AND ELECTRONIC DEVICE

CROSS-REFERENCE TO RELATED APPLICATION

This application claims the priority benefit of Taiwan application serial no. 111126896, filed on Jul. 18, 2022. The entirety of the above-mentioned patent application is hereby incorporated by reference herein and made a part of this specification.

BACKGROUND

Technology Field

The disclosure relates to a module and a device, and in particular, relates to a fan module and an electronic device.

Description of Related Art

In electronic products that need to dissipate heat to maintain performance, such as servers, electronic game consoles, etc., fan failures may occur. As such, in the design of the fan flow field of such electronic products, it is necessary to consider the airflow passing through when a fan fails. Therefore, when it comes to select related components such as fans or wind guiding covers, all conditions must be taken into consideration at the same time.

Under the above conditions, the costs of the selected fan components (e.g., fans, wind guiding covers, etc.) as solutions to the above problems are relatively high.

SUMMARY

The disclosure provides a fan module capable of blocking airflow when the fan stops functioning.

The disclosure provides an electronic device with good heat dissipation capability.

The disclosure provides a fan module including a fan, a baffle, an electromagnet, a ferromagnetic slider, and a first connector. The fan has an air inlet. The baffle is disposed at the air inlet of the fan and is adapted to expose or shield the air inlet. The electromagnet is electrically connected to the fan. The ferromagnetic slider is disposed between the electromagnet and the fan and is capable of moving between the electromagnet and the fan. The first connector is connected between the ferromagnetic slider and the baffle, so that the ferromagnetic slider is linked to the baffle. When the fan is functioning, the electromagnet attracts the ferromagnetic slider to drive the baffle to move to an open position to expose the air inlet. When the fan is powered off, the electromagnet does not attract the ferromagnetic slider, the first connector drives the ferromagnetic slider away from the electromagnet, and the baffle moves to a shielding position to shield the air inlet.

The disclosure further provides an electronic device including a casing and a plurality of fan modules. The casing has a plurality of sliding rails, and the fan modules are disposed in the casing. Each of the fan modules includes a fan, a baffle, an electromagnet, a ferromagnetic slider, and a first connector. The fan has an air inlet. The baffle is disposed at the air inlet of the fan and is adapted to expose or shield the air inlet. The electromagnet is electrically connected to the fan. The ferromagnetic slider is disposed on the corresponding sliding rail, is located between the electromagnet and the fan, and is capable of moving between the electromagnet and the fan along the corresponding sliding rail. The first connector is connected between the ferromagnetic slider and the baffle, so that the ferromagnetic slider is linked to the baffle. When the fan is functioning, the electromagnet attracts the ferromagnetic slider to drive the baffle to move to an open position to expose the air inlet. When the fan is powered off, the electromagnet does not attract the ferromagnetic slider, the first connector drives the ferromagnetic slider away from the electromagnet, and the baffle moves to a shielding position to shield the air inlet.

In an embodiment of the disclosure, the baffle is pivotally connected to the fan.

In an embodiment of the disclosure, the first connector is a spring.

In an embodiment of the disclosure, when the fan is powered off, the electromagnet has no magnetic attraction.

In an embodiment of the disclosure, the ferromagnetic slider is a permanent magnet.

In an embodiment of the disclosure, a second connector connected between the baffle and the fan is further included. The second connector is adapted to drive the baffle to move to the shielding position to shield the air inlet.

To sum up, in the fan module provided by the disclosure, when the fan is powered off, the baffle is used to shield the air inlet to prevent airflow from entering the failed fan. Therefore, when the fan module of the present disclosure is applied to the electronic device, the airflow is prevented from entering the failed fan and affecting the heat dissipation of the entire flow field, and the electronic device thereby has a good heat dissipation capability to maintain its performance.

To make the aforementioned more comprehensible, several embodiments accompanied with drawings are described in detail as follows.

BRIEF DESCRIPTION OF THE DRAWINGS accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
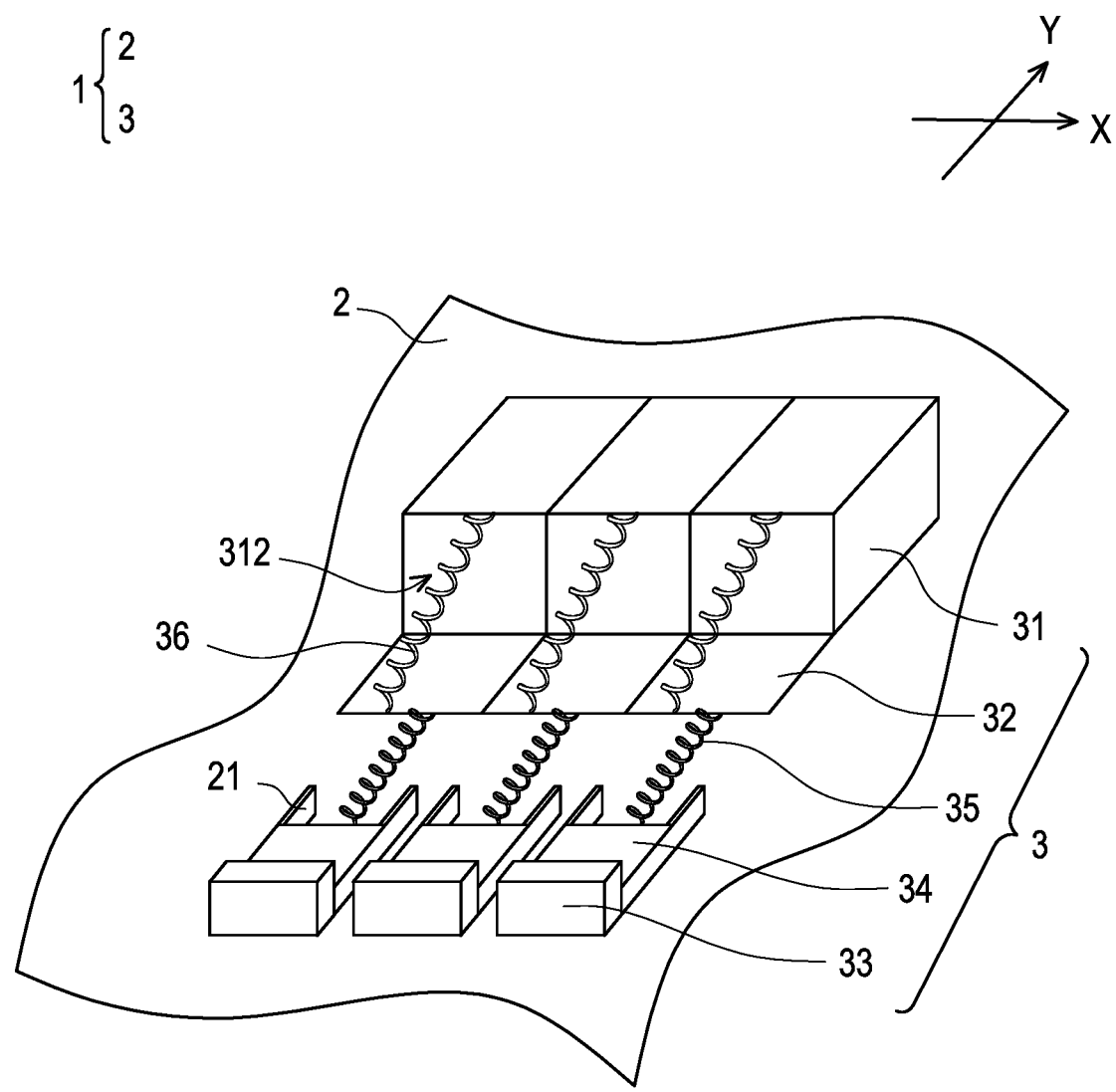
FIG. 1 is a schematic view of an air inlet of a fan exposed by a baffle of a fan module in an electronic device according to an embodiment of the disclosure.
Figure 2:
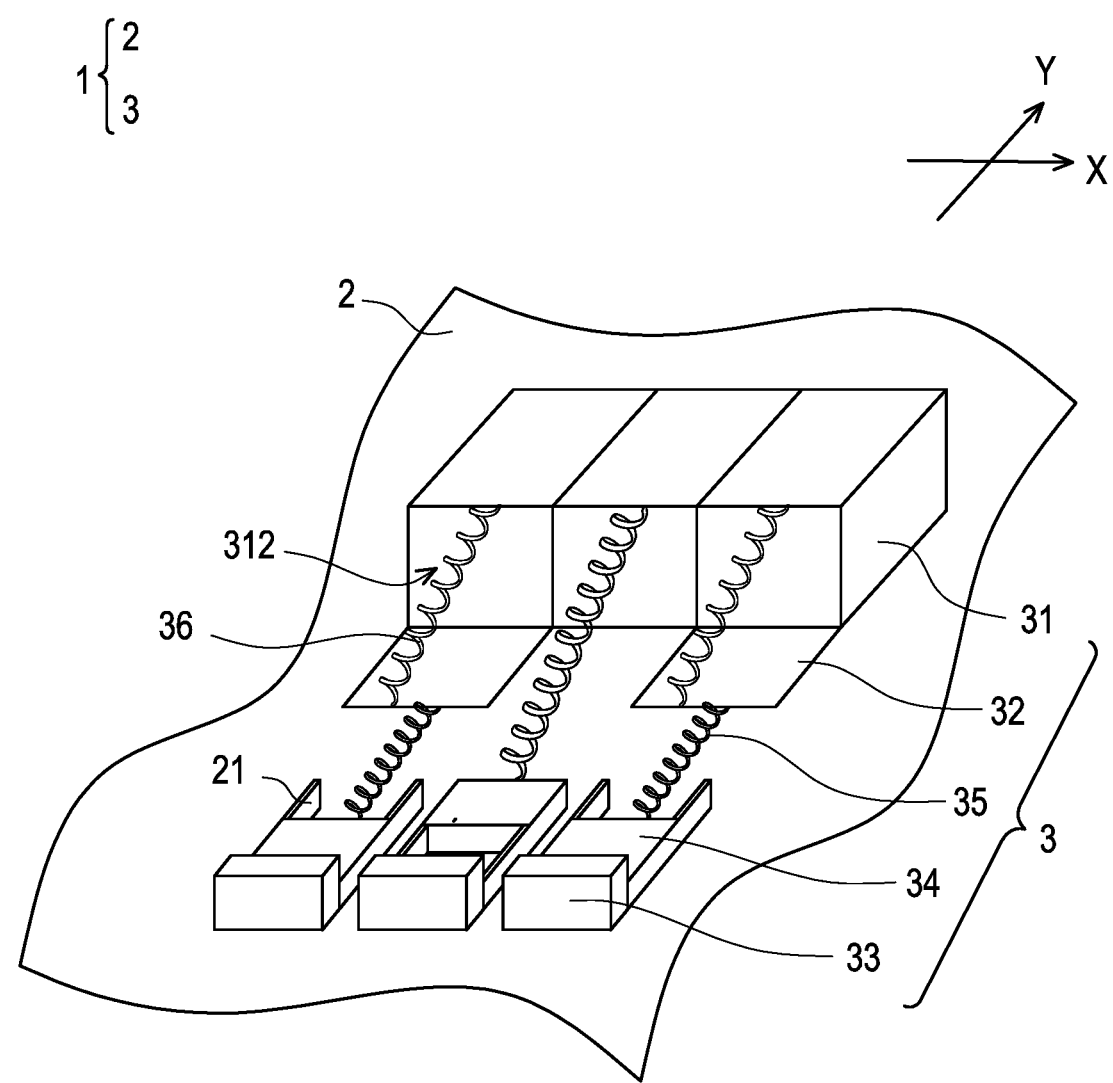
FIG. 2 is a schematic view of a baffle shielding an air inlet of a fan when the fan of a fan module of an electronic device fails according to an embodiment of the disclosure.

FIG. 1 is a schematic view of an air inlet of a fan exposed by a baffle of a fan module in an electronic device according to an embodiment of the disclosure. FIG. 2 is a schematic view of a baffle shielding an air inlet of a fan when the fan of a fan module of an electronic device fails according to an embodiment of the disclosure.

With reference to FIG. 1 and FIG. 2 together, an electronic device 1 of this embodiment is, for example, a server or a switch that requires heat dissipation capability. The electronic device 1 includes a casing 2 and a plurality of fan modules 3. The casing 2 has a plurality of sliding rails 21, and the fan modules 3 are arranged in the casing 2 side by side. The side by side arrangement herein means that an arrangement direction X of the fans is perpendicular to a length direction Y of the sliding rails 21. In this embodiment, three fan modules 3 are disposed in the casing 2 of the electronic device 1.

With the above, each of the fan modules 3 includes a fan 31, a baffle 32, an electromagnet 33, a ferromagnetic slider 34, a first connector 35, and a second connector 36. The fan 31 has an air inlet 312. The baffle 32 is disposed at the air inlet 312 of the fan 31 and is adapted to expose or shield the air inlet 312. The electromagnet 33 is electrically connected to the fan 31. The ferromagnetic slider 34 is disposed on the corresponding sliding rail 21, is located between the electromagnet 33 and the fan 31, and is capable of moving between the electromagnet 33 and the fan 31 along the corresponding sliding rail 21. The first connector 35 is connected between the ferromagnetic slider 34 and the baffle 32, so that the ferromagnetic slider 34 is linked to the baffle 32. The second connector 36 is connected between the baffle 32 and the fan 31. Herein, a bottom end (not shown) of the baffle 32 is pivotally connected to a bottom portion (not shown) of the fan 31, and the second connector 36 is connected between a top end (not shown) of the baffle 31 and a top portion (not shown) of the fan 31.

In this embodiment, both the first connector 35 and the second connector 36 are springs, but it is not limited thereto. To be specific, the bottom end of the baffle 32 is pivotally connected to the bottom portion of the fan 31. Therefore, a top end of the baffle 32 can treat the bottom end of the baffle 32 as a rotation axis and can be unfolded and folded relative to the air inlet 312 of the fan 31 by the elastic force of the second connector 36. One end of the first connector 35 is connected to the ferromagnetic slider 34, and the other end of the first connector 35 is connected to an upper edge of the baffle 32. With the same function, other components, such as rods, may also be used as the first connector 35 and the second connector 36, and the arrangement and position of its related linking components may be changed accordingly.

With reference to FIG. 1 and FIG. 2 again, when the fan 31 is functioning, the electromagnet 33 is powered and attracts the ferromagnetic slider 34 to drive the baffle 32 to move to an open position to expose the air inlet 312. To be specific, the bottom end of the baffle 32 is pivotally connected to the bottom portion of the fan 31, and the first connector 35 is connected to the top end of the baffle 32. Therefore, when the electromagnet 33 is powered, the electromagnet 33 generates a magnetic attraction force, attracts the ferromagnetic slider 34 to move towards the electromagnet 33, and is attracted by the electromagnet 33. The movement of the ferromagnetic slider 34 drives the first connector 35 to pull the top end of the baffle 32, so that the baffle 32 moves (rotates) to the open position with the bottom end pivotally connected to the bottom portion of the fan 31 which works as the rotation axis. Herein, the baffle 32 is affected by the pulling force of the first connector 35 and is tilted to expose the air inlet 312 of the fan 31, and the second connector 36 stretches and stores an elastic restoring force. The fan 31 functions and sucks the surrounding air to form a flow field.

Incidentally, the tilted baffle 32 can also guide the flow of air at the same time, so it can be used as a wind guiding cover, and an additional wind guiding cover is optional according to the situation. The tilting angle of the baffle 32 may be designed according to needs.

It should be noted that when one of the fans 31 fails (in this embodiment, the middle fan 31 fails), the failed fan 31 is powered off, the electromagnet 33 no longer attracts the ferromagnetic slider 34, and the elastic restoring force of the first connector 35 drives the ferromagnetic slider 34 away from the electromagnet 33. Herein, the elastic restoring force stored in the second connector 36 drives the baffle 32 to move to a shielding position to shield the air inlet 312.

To be specific, in this embodiment, the fan 31 is electrically connected to the electromagnet 33 in such a way that the electromagnet 33 becomes non-magnetic as the fan 31 is powered off. Therefore, when the electromagnet 33 is not magnetic due to no power, the electromagnet 33 no longer attracts the ferromagnetic slider 34. Herein, the first connector 35 drives the ferromagnetic slider 34 away from the electromagnet 33 through its elastic restoring force. Further, with the elastic restoring force of the second connector 36, the tilted baffle 32 is driven to move (rotate) to the shielding position with the bottom end pivotally connected to the bottom portion of the fan 31 which works as the rotation axis for shielding the air inlet 312.

In this way, no air can enter and exit the failed fan 31 located in the middle. Therefore, the fan 31 in the middle does not generate airflow to affect the airflow of the two outer fans 31, and the integrity of the flow field of the two outer fans 31 may stay intact.

In view of the foregoing, in the fan module provided by the disclosure, when the fan is powered off, the baffle is used to shield the air inlet of the fan, so as to prevent airflow from entering and exiting the failed fan and affecting the flow field of the surrounding fans that are still functioning. Therefore, the integrity of the flow field of other individual fan modules that are still functioning around the failed fan module can be preserved. Further, because each individual fan module has a complete flow field, a failed fan module may not affect the heat dissipation of the entire flow field of other fan modules according to the present disclosure. Therefore, the electronic device has a good heat dissipation capability to maintain its performance.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A fan module, comprising:
   a fan having an air inlet;
   a baffle disposed at the air inlet of the fan, adapted to expose or shield the air inlet;
   an electromagnet electrically connected to the fan;
   a ferromagnetic slider disposed between the electromagnet and the fan and capable of moving between the electromagnet and the fan; and
   a first connector connected between the ferromagnetic slider and the baffle so that the ferromagnetic slider is linked to the baffle,
   wherein when the fan is functioning, the electromagnet attracts the ferromagnetic slider to drive the baffle to move to an open position to expose the air inlet, and when the fan is powered off, the electromagnet does not attract the ferromagnetic slider, the first connector drives the ferromagnetic slider away from the electromagnet, and the baffle moves to a shielding position to shield the air inlet.

2. The fan module according to claim 1, wherein the baffle is pivotally connected to the fan.

3. The fan module according to claim 2, wherein the first connector is a spring.

4. The fan module according to claim 1, wherein when the fan is powered off, the electromagnet has no magnetic attraction.

5. The fan module according to claim 1, wherein the ferromagnetic slider is a permanent magnet.

6. The fan module according to claim 1, further comprising a second connector connected between the baffle and the fan, wherein the second connector is adapted to drive the baffle to move to the shielding position to shield the air inlet.

7. An electronic device, comprising:
 a casing having a plurality of sliding rails; and
 a plurality of fan modules disposed in the casing, wherein each of the fan modules comprises:
  a fan having an air inlet;
  a baffle disposed at the air inlet of the fan, adapted to expose or shield the air inlet;
  an electromagnet electrically connected to the fan;
  a ferromagnetic slider disposed on the corresponding sliding rail, located between the electromagnet and the fan, and capable of moving between the electromagnet and the fan along the corresponding sliding rail; and
  a first connector connected between the ferromagnetic slider and the baffle so that the ferromagnetic slider is linked to the baffle,
  wherein when the fan is functioning, the electromagnet attracts the ferromagnetic slider to drive the baffle to move to an open position to expose the air inlet,
  wherein when the fan is powered off, the electromagnet does not attract the ferromagnetic slider, the first connector drives the ferromagnetic slider away from the electromagnet, and the baffle moves to a shielding position to shield the air inlet.

8. The electronic device according to claim 7, wherein the baffle is pivotally connected to the fan.

9. The electronic device according to claim 7, wherein the first connector is a spring.

10. The electronic device according to claim 7, wherein when the fan is powered off, the electromagnet has no magnetic attraction.

11. The electronic device according to claim 7, wherein the ferromagnetic slider is a permanent magnet.

12. The electronic device according to claim 7, further comprising a second connector connected between the baffle and the fan, wherein the second connector is adapted to drive the baffle to move to the shielding position to shield the air inlet.

* * * * *